United States Patent
Lee

(10) Patent No.: US 7,768,828 B2
(45) Date of Patent: *Aug. 3, 2010

(54) FLASH MEMORY DEVICE CAPABLE OF STORING MULTI-BIT DATA AND SINGLE-BIT DATA

(75) Inventor: Jin-Yub Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 12/199,834

(22) Filed: Aug. 28, 2008

(65) Prior Publication Data

US 2008/0316819 A1 Dec. 25, 2008

Related U.S. Application Data

(63) Continuation of application No. 11/492,151, filed on Jul. 25, 2006, now Pat. No. 7,433,246.

(30) Foreign Application Priority Data

Jul. 28, 2005 (KR) ............... 2005-69131

(51) Int. Cl.
*G11C 11/34* (2006.01)
(52) U.S. Cl. ............... 365/185.03; 365/235.4; 365/240
(58) Field of Classification Search ............ 365/185.03, 365/235.5, 240
See application file for complete search history.

(56) References Cited

U.S. PATENT DOCUMENTS

| | | | |
|---|---|---|---|
| 6,046,933 A | | 4/2000 | Nobukata et al. |
| 6,297,988 B1 | | 10/2001 | Parker et al. |
| 6,407,944 B1 | * | 6/2002 | Choi et al. ............. 365/185.09 |
| 6,898,117 B2 | * | 5/2005 | So et al. ................ 365/185.03 |
| 6,914,795 B1 | * | 7/2005 | Srinivasan et al. ....... 365/49.18 |
| 2005/0057995 A1 | | 3/2005 | Mitani et al. |
| 2005/0144362 A1 | | 6/2005 | Lin et al. |

FOREIGN PATENT DOCUMENTS

JP 11-224491 8/1999

(Continued)

*Primary Examiner*—Son Dinh
(74) *Attorney, Agent, or Firm*—Volentine & Whitt, PLLC

(57) ABSTRACT

There is provided a flash memory device capable of manipulating multi-bit and single-bit data. The flash memory device can include a memory cell array with a plurality of memory blocks. The flash memory device can also include a judgment circuit for storing multi-bit/single-bit information indicating whether each of the memory blocks is a multi-bit memory block or not, determining whether or not a memory block of an inputted block address is a multi-bit memory block according to the stored multi-bit/single-bit information and outputting an appropriate flag signal. A read/write circuit for selectively performing multi-bit and single-bit read/program operations of the memory block corresponding to the block address is also included, as well as control logic for controlling the read/write circuit such that the read/write circuit can perform multi-bit or single-bit read/program operations based on the flag signal. An error checking and correction (ECC) circuit including a multi-bit ECC unit and a single-bit ECC unit for checking and correcting an error in a data of the read/write circuit can also be included.

16 Claims, 11 Drawing Sheets

FOREIGN PATENT DOCUMENTS

| | | |
|---|---|---|
| JP | 2003-022687 | 1/2003 |
| JP | 2005-092923 | 4/2005 |
| KR | 1998-021156 | 6/1998 |
| KR | 100172406 B1 | 10/1998 |
| KR | 1999-013057 | 2/1999 |
| KR | 100332950 B1 | 4/2002 |
| KR | 1020030023349 A | 3/2003 |
| KR | 10020050027037 A | 3/2005 |

* cited by examiner

FLASH MEMORY DEVICE CAPABLE OF STORING MULTI-BIT DATA AND SINGLE-BIT DATA

CROSS-REFERENCE TO RELATED APPLICATION

This is a Continuation application of U.S. non-provisional application no. 11/492,151, filed Jul. 25, 2006, the entirety of which is incorporated herein by reference.

BACKGROUND OF THE INVENTION

1. Field of the Invention

The present invention relates to memory devices, and more particularly to nonvolatile memory devices having single-bit and multi-bit storage regions.

2. Description of the Related Art

Market forces have dictated a gradual demand increase for high-capacity memory devices that don't require periodic refresh. A NAND flash memory device is a nonvolatile memory device which provides the large capacity, high integrity and ease of use demanded by consumers. Since NAND flash memories retain data even if a power is turned off, NAND flash memory devices are well-suited for certain electronic devices, such as mobile terminals, mobile computers, and so forth, where a power supply can be abruptly interrupted.

As is well known in the flash-memory semiconductor industry, the data-retention characteristics and the number of program/erase cycles of flash memories are primarily related to the reliability of the floating gate structure that is the basis of the underlying technology. Various failure mechanisms include the lowering or raising of a cell transistor's threshold voltage through the errant release or accumulation of charges (electrons). Further, the repetition of program/erase cycles can stress the tunnel oxide layer at the bottom of a cell transistor's floating gate, which can result in the eventual destruction of the tunnel oxide layer. Additional problems can also arise as charges are trapped in the tunnel oxide layer during program/erase operations, which can change the threshold voltage windows and the program/erase times of the memory device.

Flash memory devices can store single-bit data or multi-bit data depending on how their memory cells control and respond to threshold voltages. For instance, single-bit data can represented by two voltage ranges separated by a threshold voltage with the two voltage ranges corresponding respectively to data '1' and data '0', whereas 2-bit data can be represented by four voltage ranges separated by three threshold voltage levels with the four voltage ranges corresponding respectively to data '11', data '10', data '00', and data '01'.

In general practice, the reliability of multi-bit flash memory devices is less than that of single-bit flash memory devices as multi-bit flash memory devices tend to be more sensitive to the above-mentioned characteristics influencing reliability. For this reason, multi-bit flash memory devices are used for simple data storage while critical or secure data is stored in single-bit flash memory devices (or some other high-reliability memory). Unfortunately, this practice can increase systems memory costs. Accordingly, new technology related to flash memories is desirable.

SUMMARY OF THE INVENTION

The present invention provides a nonvolatile memory device capable of storing single-bit data and multi-bit data.

Embodiments of the present invention provide flash memory devices include a memory cell array including a plurality of memory blocks, a judgment circuit for storing multi-bit/single-bit information indicating whether each of the memory blocks is a multi-bit memory block or not, determining whether or not a memory block of an inputted block address is the multi-bit memory block according to the stored multi-bit/single-bit information, and outputting a flag signal as a judgment result, a read/write circuit for selectively performing a multi-bit and single-bit read/program operations of the memory block corresponding to the block address, a control logic for controlling the read/write circuit such that the read/write circuit performs one operation of the multi-bit and single-bit read/program operations according to whether or not the flag signal indicates a selection of a multi-bit memory block, and an error checking and correction (ECC) circuit including a multi-bit ECC unit and a single-bit ECC unit, for checking and correcting an error in a data of the read/write circuit, wherein the multi-bit and single-bit ECC units selectively operate by the flag signal.

In some embodiments, the memory cell array is partitioned into a multi-bit storage region and a single-bit storage region.

In other embodiments, the judgment circuit can include a first block address storing unit for storing a block address of a first memory block among memory blocks of the multi-bit storage region, a second block address storing unit for storing a block address of a final memory block among memory blocks of the multi-bit storage region, and a detector for detecting whether or not the block address is the multi-bit storage region, and outputting the flag signal as a detection result.

In further embodiments, the block addresses of the first and final memory blocks are provided from an external device in a power-up mode such that they are stored in the first and second block address storing units.

In yet other embodiments, the judgment circuit can include a decoder for activating one of selection lines corresponding to the respective memory blocks by decoding a register address, a register including register regions corresponding to the respective selection lines, for storing the multi-bit/single-bit information when the corresponding selection line is activated, and a selector for selecting one of the register regions in response to the block address, and outputting multi-bit/single-bit information of the selected register as the flag signal.

In yet further embodiments, multi-bit/single-bit information of the memory blocks is selectively stored in the register regions through the decoder in a power-up mode.

In some embodiments, the register is initialized such that the memory blocks are designated as a single-bit memory block.

In other embodiments, the multi-bit ECC circuit corrects N-bit error, where n is a positive integer of 2 or higher, and the single-bit ECC circuit corrects 1-bit errors.

In further embodiments of the present invention, the flash memory devices further include a status bit line arranged in the memory cell array such that the status bit line is shared by the memory blocks.

In yet other embodiments, the control logic can control the read/write circuit in response to the flag signal such that multi-bit/single-bit information is stored in a selected memory block through the status bit line.

In yet further embodiments, the control logic can control the read/write circuit such that multi-bit/single-bit information of the memory block selected through the status bit line is read out to an external device in a status read operation.

In some embodiments, the control logic can include a program control unit including a multi-bit program controller for controlling a multi-bit program operation of the read/write circuit, and a single-bit program controller for controlling a single-bit program operation of the read/write circuit, and a read control unit including a multi-bit read controller for controlling a multi-bit read operation of the read/write circuit, and a single-bit read controller for controlling a single-bit read operation of the read/write circuit, wherein the multi-bit and single-bit program controllers operate selectively according to the flag signal, and the multi-bit and single-bit read controllers operate selectively according to the flag signal.

In other embodiments of the present invention, there are provided flash memory devices including a memory cell array including a plurality of memory blocks, a status bit line arranged in the memory cell array such that it is shared by the memory blocks, a judgment circuit for storing multi-bit/single-bit information indicating whether each of the memory blocks is a multi-bit memory block or not, determining whether or not a memory block of an inputted block address is the multi-bit memory block according to the stored multi-bit/single-bit information, and outputting a flag signal as a judgment result, a read/write circuit for selectively performing a multi-bit and single-bit read/program operations of the memory block corresponding to the block address, a control logic for controlling the read/write circuit such that the read/write circuit performs one operation of the multi-bit and single-bit read/program operations according to the flag signal, wherein the control logic can control the read/write circuit in response to the flag signal such that multi-bit/single-bit information is stored in a selected memory block through the status bit line in a program operation.

In further embodiments, the control logic can control the read/write circuit such that multi-bit/single-bit information of the memory block selected through the status bit line is read out, and outputting the read-out information to an external device, in a status read operation.

In yet other embodiments, the memory cell array is partitioned into a multi-bit storage region and a single-bit storage region.

In yet further embodiments, the judgment circuit can include a first block address storing unit for storing a block address of a first memory block among memory blocks of the multi-bit storage region, a second block address storing unit for storing a block address of a final memory block among memory blocks of the multi-bit storage region, and a detector for detecting whether or not the block address is the multi-bit storage region and outputting the flag signal as a detection result.

In some embodiments, the block addresses of the first and final memory blocks are provided from an external device in a power-up mode such that they are stored in the first and second block address storing units.

In other embodiments, the judgment circuit can include a decoder for activating one of selection lines corresponding to the respective memory blocks by decoding a register address, a register including register regions corresponding to the respective selection lines, for storing the multi-bit/single-bit information when the corresponding selection line is activated, and a selector for selecting one of the register regions in response to the block address, and outputting multi-bit/single-bit information of the selected register as the flag signal.

In further embodiments, multi-bit/single-bit information of the memory blocks is selectively stored in the register regions through the decoder in a power-up mode.

In yet other embodiments, the register is initialized such that the memory blocks are designated as a single-bit memory block.

In yet further embodiments of the present invention, the flash memory devices further include an error checking and correction (ECC) circuit including a multi-bit ECC unit and a single-bit ECC unit, for checking and correcting an error in a data of the read/write circuit, wherein the multi-bit and single-bit ECC units selectively operate by the flag signal.

In other embodiments, the multi-bit ECC circuit corrects N-bit errors, where n is a positive integer of 2 or higher, and the single-bit ECC circuit corrects 1-bit errors.

It should be understood that both the foregoing general description and a following detailed description are merely illustrative, and it should be construed that supplementary descriptions for claimed inventions be provided.

Reference symbols are represented in detail in preferred embodiments of the present invention, of which examples are denoted in the accompanying drawings. In any possible case, like reference numerals refer to like or similar elements throughout the drawings.

In below, a nonvolatile memory device is used as one example for illustrating characteristics and functions of the present invention. However, those skilled in the art may easily understand other advantages and performance of the present invention according to contents described herein. The present invention may be implemented or applied through other embodiments. In addition, the detailed description may be modified or altered, not deviating far from the scope of the present invention, the technical idea of the present invention, and other objects of the present invention.

BRIEF DESCRIPTION OF THE DRAWINGS

The accompanying drawings, which are included to provide a better understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention.

Figure 1:
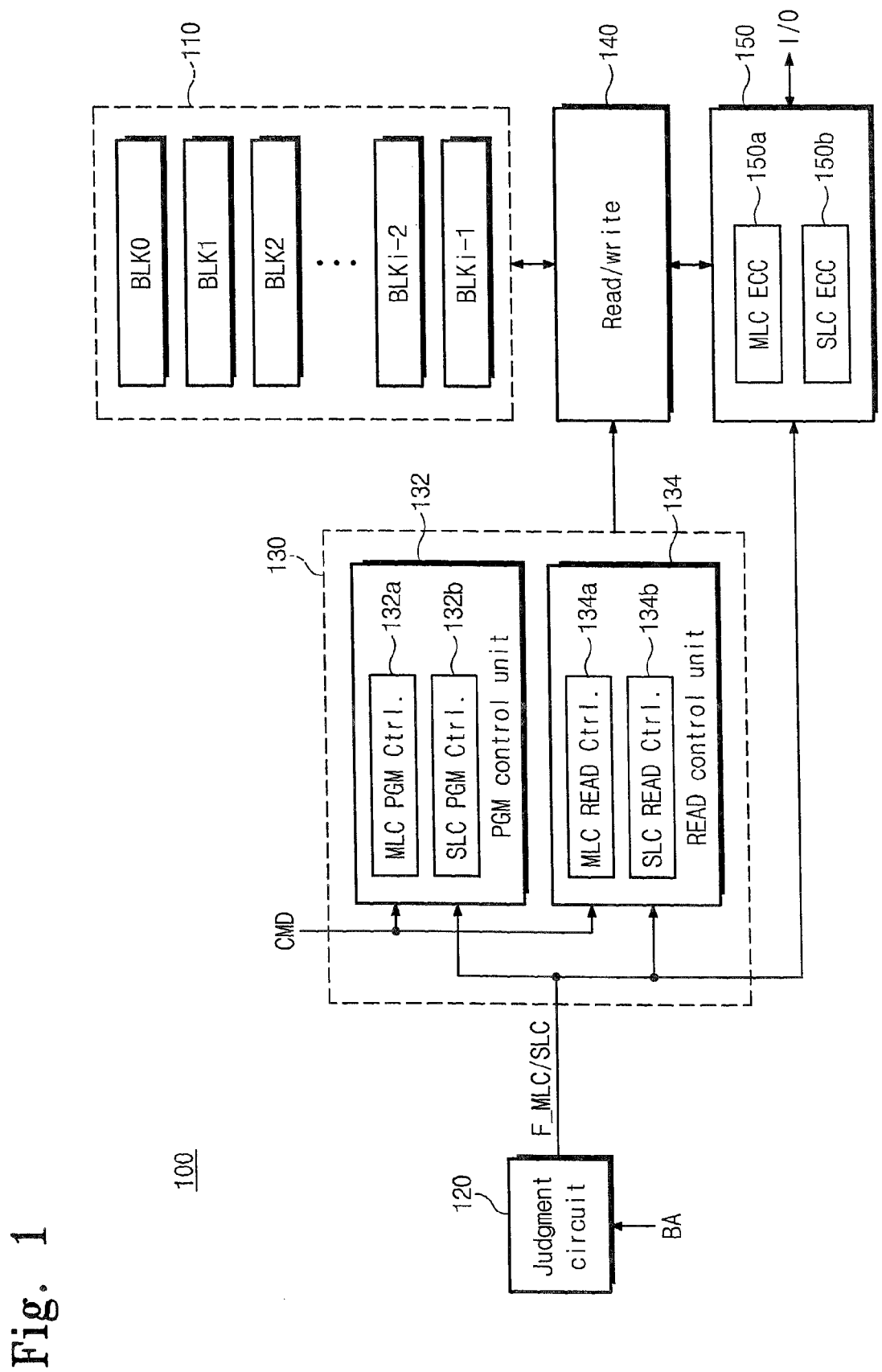
FIG. 1 is a block diagram of a flash memory device according to a first embodiment of the preset invention.

FIG. 1 is a block diagram of a flash memory device 100 according to a first embodiment of the preset invention. As shown in FIG. 1, the flash memory device 100 can include a memory cell array 110 that can include a plurality of memory blocks BLK0~BLKi-1 with the memory blocks BLK0~BLKi-1 classified into two groups: a first group used to store single-bit data, and a second group used to store multi-bit data. The memory blocks BLK0~BLKi-1 can share a common configuration, of which one such memory block (BLK0) is depicted in FIG. 2.

Figure 2:
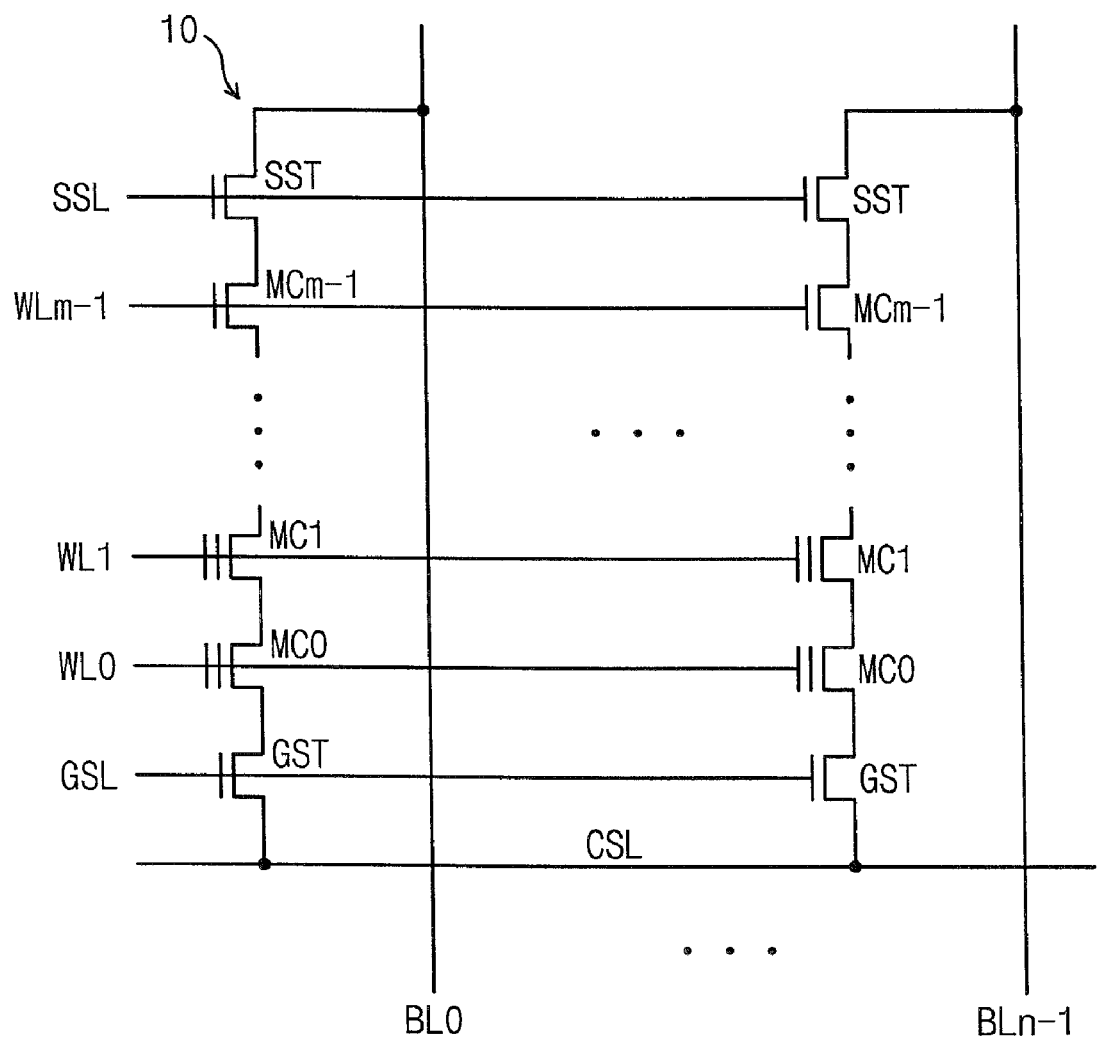
FIG. 2 is a circuit diagram illustrating a memory block of FIG. 1.

Referring to FIG. 2, the exemplary memory block BLK0 can include a plurality of "cell strings" 10 (also known as "NAND strings") with each cell string corresponding to respective bit lines BL0~BLn-1. Each cell string 10 can include a "string select transistor" SST, a "ground select transistor" GST and a plurality of memory cells MCm-1~MC0 connected in series between the select transistors SST and GST. Each string select transistor SST has a drain connected to a corresponding bit line BL0~BLn-1 and a gate connected to a "string select line" SSL. Each ground select transistor GST has a source connected to a "common source line" CSL and a gate connected to a "ground select line" GSL. The memory cells MCm-1~MC0 are connected in series between the sources of the string select transistor SST and the drains of the ground select transistor GSL as well as to corresponding word lines WL0~WLm-1. Note that the bit lines BL0~BLn-1 are shared by the memory blocks BLK0~BLKi-1 of FIG. 1.

Returning to FIG. 1, the flash memory device 100 of the present invention further can include a judgment circuit 120, control logic 130, a read/write circuit 140, and an error checking and correction (ECC) circuit 150.

The judgment circuit 120 can be configured so as to store information indicating multi-bit data storage regions and single-bit data storage regions. For instance, the judgment circuit 120 can store one or more block addresses for selecting the first (start) and final memory blocks of a designated multi-bit data storage region. Alternatively, the judgment circuit 120 may store multi-bit/single-bit information (hereinafter referred to as "MLC/SLC information") for each memory block of the memory cell array 110, which will be set forth in detail later. The judgment circuit 120 can judge whether each memory block to be selected by a block address BA is a multi-bit memory block or a single-bit memory block. Based on the judgment results, the judgment circuit 120 can generate a flag signal F_MLC/SLC that can be used to indicate whether or not the respective memory block is a multi-bit memory block.

The control logic 130 can include a program control unit 132 and a read control unit 134, and can be used to control the read/write circuit 140 in response to the flag signal F_MLC/SLC from the judgment circuit 120 as well as a command signal CMD.

The program control unit 132 can include a multi-bit program controller 132*a* and a single-bit program controller 132*b* program control unit 132, and can be configured to control a program operation of the memory device 100 when the command signal CMD indicates a program operation. When the flag signal F_MLC/SLC indicates selection of a multi-bit memory block, the multi-bit program controller 132*a* can control a multi-bit program operation in response to the flag signal F_MLC/SLC and command signal CMD.

The read control unit 134 can include a multi-bit read controller 134*a* and a single-bit read controller 134*b*, and can be configured to control a read operation of the memory device 100 when the command signal CMD indicates the read operation. When the flag signal F_MLC/SLC indicates selection of a multi-bit memory block, the multi-bit read controller 134*a* can control a multi-bit read operation in response to the flag signal F_MLC/SLC and the command signal CMD. When the flag signal F_MLC/SLC represents selection of a single-bit memory block, the single-bit read controller 134*b* can control a single-bit read operation in response to the flag signal F_LC/SLC and the command signal CMD.

Continuing with FIG. 1, controlled by the control logic 130 the read/write circuit 140 can select one memory block among the memory blocks BLK0~BLKi-1. The read/write circuit 140 can select a page/row of the selected memory block and can read/write data from/to memory cells of the selected row.

Note that the read/write circuit 140 can be configured to read and write both single-bit data and multi-bit data. When programming multi-bit data, the read/write circuit 140 can be controlled by the multi-bit program controller 132*a* of the control logic 130, while when programming single-bit data the read/write circuit 140 can be controlled by the single-bit program controller 132*b*. Likewise, when reading multi-bit data the read/write circuit 140 can be controlled by the multi-bit read controller 134*a*, while when reading single-bit data the read/write circuit 140 can be controlled by the single-bit read controller 134*b*.

Although not shown in the drawings, the read/write circuit 140 can include a row selection circuit, a column selection circuit, a page buffer circuit and other assorted devices with the page buffer circuit configured to perform the read/write operations for both single-bit memory blocks and multi-bit memory blocks. An exemplary page buffer circuit having such a function is disclosed in Korean Patent No. 10-172406, titled "NONVOLATILE SEMICONDUCTOR DEVICE", which is herein incorporated by reference for all purposes with the caveat that the page buffer of the present disclosure is not limited to the disclosure of the Korean Patent. For example, it should be appreciated that the read/write circuit 140 can incorporate separate page buffer circuits for multi-bit data and single-bit data.

When a program operation is performed, the ECC circuit 150 can generate error correcting code data (hereinafter, referred to as "ECC data") from data transmitted to the read/write circuit 140, and can transfer the generated ECC data to the read/write circuit 140.

During a read operation, the ECC circuit 150 can detect whether errors are included in data transmitted from the read/write circuit 140. More particularly, the ECC circuit 150, which can include can include a multi-bit ECC unit 150*a* and a single-bit ECC unit 150*b*, can receive the flag signal F_MLC/SLC from the judgment circuit 120 whereupon the multi-bit ECC unit 150*a* will operate when the flag signal F_MLC/SLC indicates a multi-bit memory block and the single-bit ECC unit 150*b* will operate when the flag signal F_MLC/SLC indicates a single-bit memory block. During operation, the multi-bit ECC unit 150*a* can check and correct N-bit errors, and the single-bit ECC unit 150*b* can check and correct an M-bit error (where N is the same or more than M). For example, the multi-bit ECC unit 150a may check/correct two erroneous bits while the single-bit ECC unit 150b may check/correct a single erroneous bit.

Note that it should be appreciated that the ECC circuit 150 should not be limited to the illustration in FIG. 1. For example, the ECC circuit 150 may be configured to check and correct errors of single-bit data and multi-bit data using a single ECC unit.

As mentioned in the descriptions above, the flash memory device 100 of the present invention can be configured to use some memory blocks as a multi-bit storage region and the remaining blocks as a single-bit storage region. Therefore, it is possible to reduce system costs incurred when both multi-bit memories and the more reliable single-bit memories are used.

Figure 3:
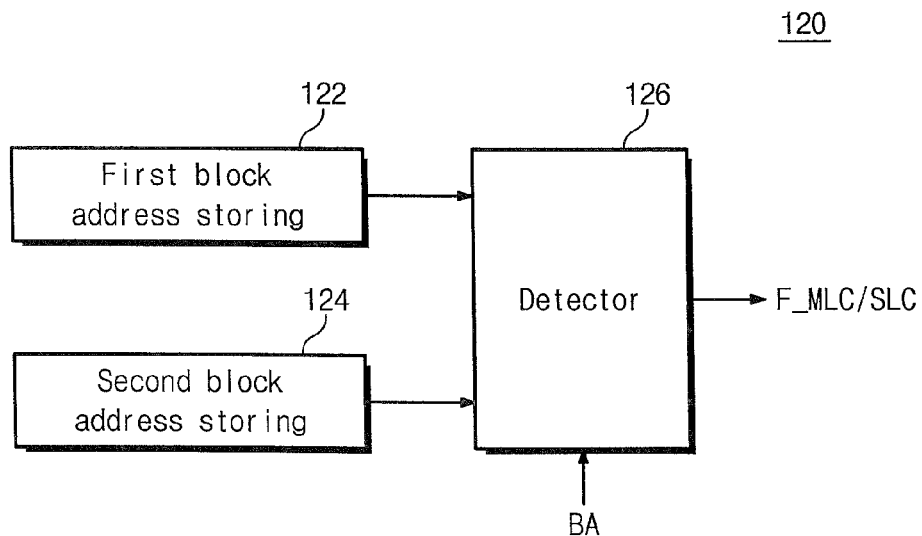
FIG. 3 is a block diagram illustrating a judgment circuit of FIG. 1 according to the first embodiment of the present invention.

FIG. 3 is a block diagram illustrating the judgment circuit 120 of FIG. 1 according to the first embodiment of the present invention for setting physically/logically continuous memory blocks as a multi-bit storage region. As shown in FIG. 3, the exemplary judgment circuit 120 can include a first block address storing unit 122, a second block address storing unit 124 and a detector 126. The first block address storing unit 122 can store a block address for selecting a start (first) memory block of the multi-bit storage region, and the second block address storing unit 124 can store a block address for selecting a respective final memory block of the multi-bit storage region. The detector 126 can detect whether a block address BA inputted during a read/write operation is within the multi-bit storage region defined by block addresses stored in the first and second block address storing units 122 and 124.

Based on detection results, the detector 126 can generate an appropriate flag signal F_MLC/SLC. For example, when the block address BA inputted during the read/write operation is within the multi-bit storage region, the detector 126 can set the flag signal F_MLC/SLC to indicate that the multi-bit storage region is selected. In contrast, when the block address BA is not within the multi-bit storage region, the detector 126 can set the flag signal F_MLC/SLC to indicate that the single-bit storing unit is selected.

In various embodiments, the first and second block address storing units 122 and 124 may be configured such that any stored information can be retained even if the power is turned off. Additionally, address information may be stored in the first and second block address storing units 122 and 124 by a user, and the block address storing units 122 and 124 may be used to define a single-bit storage rather than a multi-bit storage region.

Herebelow, an operation of the flash memory device according to the present invention will be described in detail with reference to FIGS. 1 and 3.

When a program operation begins, a command and an address can be inputted into the flash memory device 100. The inputted address can incorporate a block address, a page address, and a column address. Once the address is inputted, the judgment circuit 120 can judge whether the block address BA is a storage region defined by the block addresses stored in the first and second block address storing units 122 and 124. For the sake of convenience, it is assumed that the multi-bit storage region is defined by the block addresses stored in the first and second block address storing units 122 and 124. However, in other embodiments the storage region defined by the block addresses storing units 122 and 124 may be either a multi-bit or single-bit storage region.

If the inputted block address BA is the multi-bit storage region, the detector 126 can generate the flag signal F_MLC/SLC indicating that the multi-bit storage region (or a multi-bit memory block) is selected. As the appropriate flag signal F_MLC/SLC is generated, the multi-bit program controller 132a of the control logic 130 can control the multi-bit program operation of the flash memory device 100 in response to the flag signal F_MLC/SLC. At the same time, the multi-bit ECC unit 150a can operate in response to the flag signal F_MLC/SLC and generate ECC data for correcting n-bit errors based on the inputted data, where n is a positive integer of 2 or more. Thereafter, the program data can be loaded to the read/write circuit 140 though the multi-bit ECC unit 150a under the control of the multi-bit program controller 132a of the control logic 130 to be stored in the memory block corresponding to the block address BA.

In contrast, if the inputted block address BA does not belong to the multi-bit storage region, the program operation may be performed under the control of the single-bit program controller 132b of the control logic 130. Under these circumstances, ECC data for correcting a 1-bit error may be generated through the single-bit ECC unit 150b. Afterwards, program data can be loaded to the read/write circuit 150 through the single-bit ECC unit 150b under the control of the single-bit program controller 132b of the control logic 130 to be stored in the memory block corresponding to the block address BA.

During read operations, the same method as described above can be used to determine whether a selected memory block belongs in a single-bit or multi-bit storage region. Based on the type of storage region designated by a block address BA, the read operations may be performed according to judgment procedure under the control of the multi-bit read controller 134a or the single-bit read controller 134b of the control logic 130.

Figure 4:
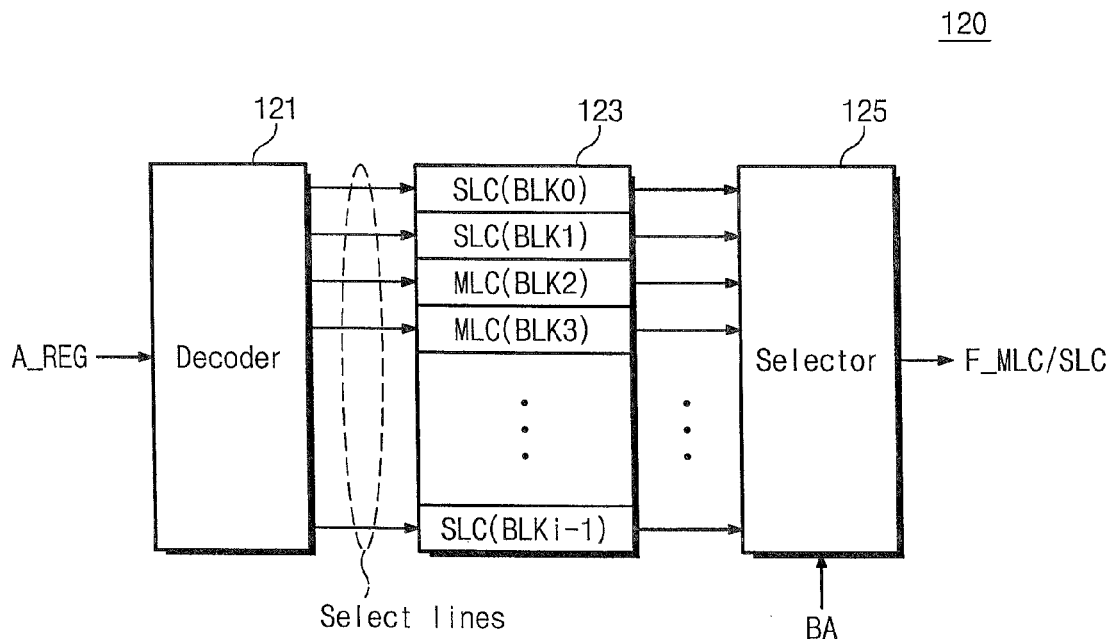
FIG. 4 is a block diagram illustrating a judgment circuit of FIG. 1 according to a second embodiment of the present invention.
Figure 5:
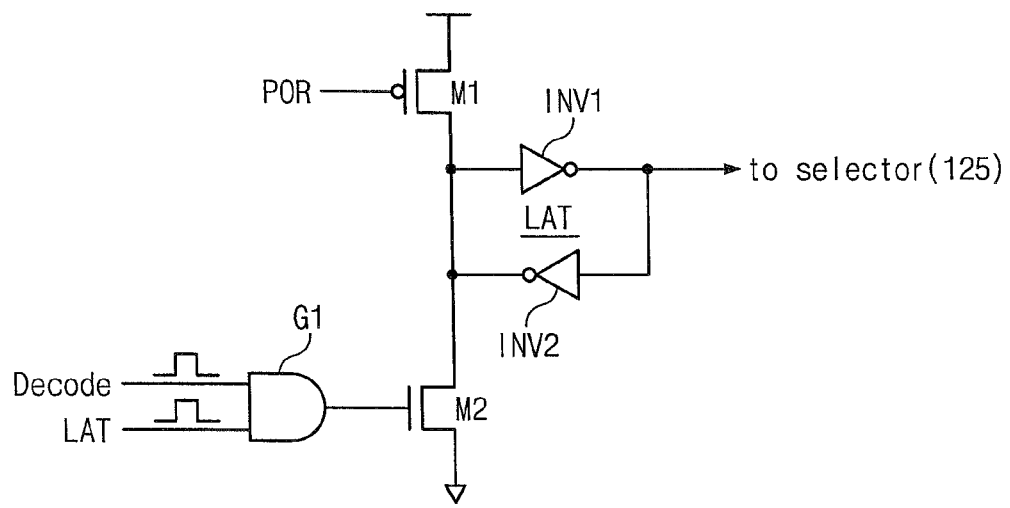
FIG. 5 is a circuit diagram illustrating a portion of a register of FIG. 4.

FIG. 4 is a block diagram illustrating the judgment circuit 120 of FIG. 1 according to a second embodiment of the present invention, and FIG. 5 is a circuit diagram illustrating a portion of a register of FIG. 4.

Referring to FIG. 4, the judgment circuit 120 can include a decoder 121, a registers 123, and a selector 125. The decoder 121 can decode a register address A_REG inputted from an external device in a power-up mode, and activate one select line among a plurality of select lines. The number of the select lines is equal to the number of the memory blocks BLK0~BLKi-1 in the memory cell array 110 of FIG. 1.

The registers 123 can operate in response to the output of the decoder 121, and can be used for storing multi-bit/single-bit region information of the memory blocks BLK0~BLKi-1 of the memory cell array 110, e.g., MLC/SLC information indicating whether or not a particular memory block is part of a multi-bit data region. The registers 123 include a plurality of register regions (corresponding to the respective memory blocks BLK0~BLKi-1) that are connected to the respective selection lines such that each register region receives a corresponding decoding signal. When one of the selection lines is activated, the MLC/SLC information can be written to the respective register region of the activated selection line.

As illustrated in FIG. 5, each register region may be configured with a latch LAT having inverters INV1 and INV2, a PMOS transistor M1, an NMOS transistor M2, and an AND gate G1. The PMOS transistor can be used for initializing the latch LAT, and is controlled by a POR control signal, which is activated to be a logic low level in the power-up mode. An initializing value (logic low level) of the latch LAT indicates that the memory block is the single-bit memory block. The AND gate G1 can control the NMOS transistor M2 in response to the decoding signal Decode and the latch signal LAT. Using such a structure, MLC/SLC information can be selectively written to each region of the register 123 by means of an external host thus allowing the multi-bit storage region and the single-bit storage region of the memory cell array 110 to be automatically set in power-up mode by an external host. Note, however, that in other embodiments, each register region can be set to a multi-bit storage region instead of a single-bit storage region at power-up. Afterwards, all or a part of the register regions may be set to a single-bit storage region by an external host.

Referring back to FIG. 4, as the selector 125 selects one of the register regions by decoding the block address BA, the MLC/SLC information of the selected register region can be output via the selector 125 as the flag signal F_MLC/SLC.

An illustrative operation of the flash memory device will be more fully illustrated with reference to FIGS. 1, 4 and 5, herebelow.

In an illustrative power-up mode, the register 123 (FIG. 4) can be initialized such that all the memory blocks BLK0~BLSi-1 are set as single-bit memory blocks. After initialization of the register 123, MLC/SLC information supplied from an external device can be stored in the register 123. For instance, by having an external host provide the flash memory device 100 with a register program command and a register address A_REG, the decoder 121 can activate the selection line of the register region corresponding to the register address A_REG. This allows multi-bit/single-bit storage region designations to be stored in the register region of the activated selection line when a latch signal LAT is generated. This process can be repeated till all the register regions will be set. After the MLC/SLC information is set, the judgment circuit 120 can perform it intended normal operations.

Once the program operation begins, a command and an address can be inputted. When the address is inputted, the judgment circuit 120 can generate flag signal F_MLC/SLC in response to the block address BA. That is, the selector 125 can select one of the register regions in response to the block address BA, and output the appropriate MLC/SLC information of the selected register region as the flag signal F_MLC/SLC.

If the generated flag signal F_MLC/SLC indicates that the multi-bit storage region is selected, the multi-bit program controller 132a can control the multi-bit program operation of the flash memory device 100. At the same time, the multi-bit ECC unit 150a can generate ECC data for correcting an n-bit error based on the inputted data (where n is a positive integer of 2 or higher) in response to the flag signal F_MLC/SLC. Thereafter, under the control of the multi-bit program controller 132a, the program data can be loaded to the read/write circuit 140 though the multi-bit ECC unit 150a, and the loaded program data may then be stored in the memory block corresponding to the block address BA.

In contrast, if the inputted block address BA is not within the multi-bit storage region, the program operation may be performed under the control of the single-bit program controller 132b, and ECC data for correcting 1-bit error may be generated through the single-bit ECC unit 150b. Afterwards, under the control of the single-bit program controller 132b, the program data can be loaded to the read/write circuit 140 through the single-bit ECC unit 150b and the loaded program data may be stored in the memory block corresponding to the block address BA.

Note that the same procedure described above can apply to a read operation as well as a program operation, i.e., a read operation may be performed according to the same judgment rules under the control of either the multi-bit read controller 134a or the single-bit read controller 134b of the control logic 130.

Figure 6:
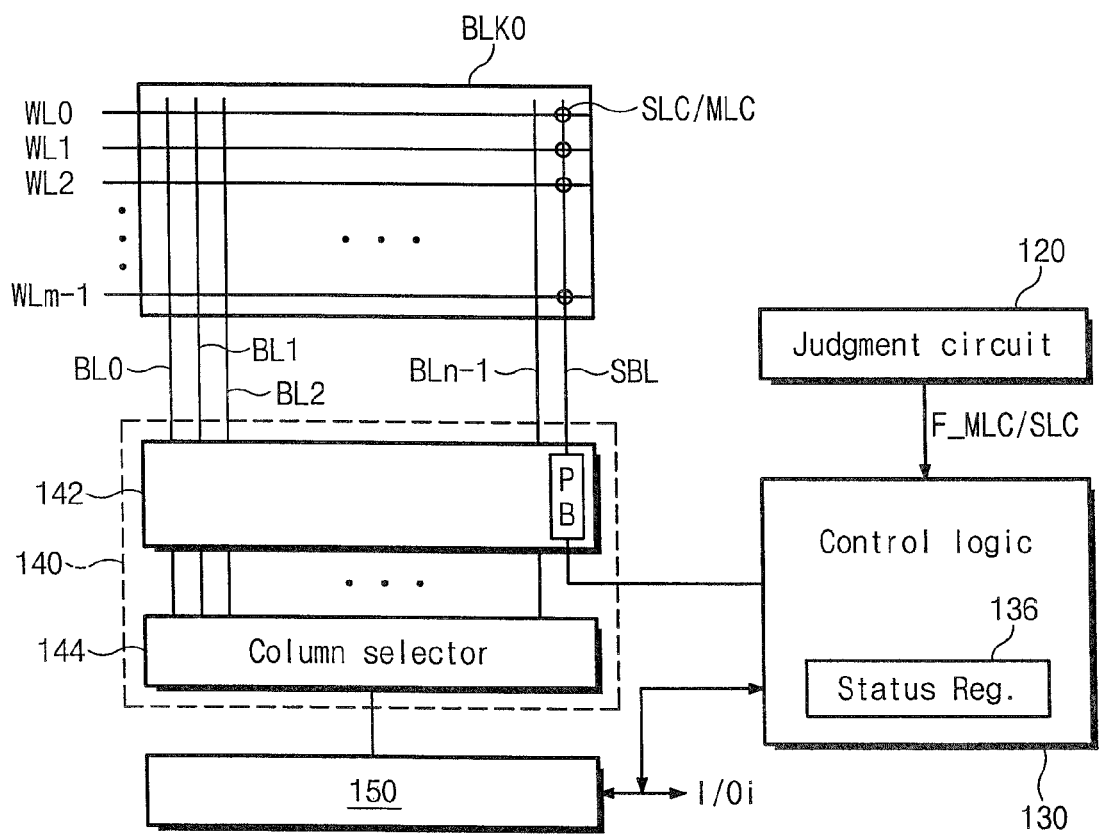
FIG. 6 is a block diagram of a flash memory device according to a second embodiment of the preset invention.

FIG. 6 is a block diagram of a flash memory device 100' according to a second embodiment of the preset invention. Like reference numerals in FIG. 6 denote like elements in FIG. 1, and thus their description will be omitted. The flash memory device 100' of FIG. 6 is identical to the flash memory device 100 of FIG. 1 except that a status bit line SBL, which is connected to a string for storing status information, is additionally employed as a hidden bit line. Although for simplicity of illustration only one memory block BLK0 is shown in FIG. 6, it should be appreciated that other memory blocks can also share the same status bit line SBL with one another.

In the present embodiment, each of the memory blocks BLK0~BLKi-1 can be configured with a first region (e.g., a main region) for storing main data, a second region (e.g., a spare region) for storing spare data, and a third region (e.g., a hidden region) for storing status data, such as MLC/SLC information. However, in other embodiments the memory blocks BLK0~BLKi-1 may be configured with but a first/main region for storing main data and a second/spare region for storing both spare data and status data.

The string connected to the status bit line SBL can be configured much the same as the strings connected to each of bit lines BLK0~BLn-1. The status bit line SBL is connected to a page buffer PB of the read/write circuit 140. The page buffer PB, under control of the control logic 130, can be configured such that it can perform a program/read operation on a single-bit data as well as a multi-bit data.

Continuing, the status information indicating whether a selected memory block BLK0~BLKi-1 is a multi-bit storage region or a single-bit storage region can be directly loaded to the page buffer PB by means of the control logic 130. Whether the selected memory block is the multi-bit storage region or not can be determined by the flag signal F_MLC/SLC of the judgment circuit 120. In an operational mode for reading the status information stored in the string of the sate bit line SBL, the status information can be read out by the page buffer PB under the control of the control logic 130, and the read-out status information can be stored in status register 136. The information stored in the status register 136 can then be output to an external host by a well-known status read operation.

Note that the above-described structure may also be used for recovering lost information if the external host loses any of the information for designating the multi-bit storage and single-bit storage regions.

In contrast with the system described above, MLC/SLC information of each memory block BLK0~BLKi-1 can be provided directly by an external host. For example, MLC/SLC information of each memory block can be provided by the external host and transferred to a read/write circuit 140 through an ECC circuit 150. The read/write circuit 140, in turn, can then store the received MLC/SLC information in a given memory cell (e.g., a memory cell at an interconnection of a first page and a status bit line SBL) through the status bit line SBL. The MLC/SLC information may be stored simultaneously with a program operation of a selected memory block or after its program operation. That is, during or after a first program operation is performed, MLC/SLC information may be stored in a memory cell of the status bit line SBL. Also note that when MLC/SLC information is provided from an external host, the MLC/SLC information may be transferred through a column selector 144 to a page buffer PB connected to the status bit line SBL.

Figure 7:
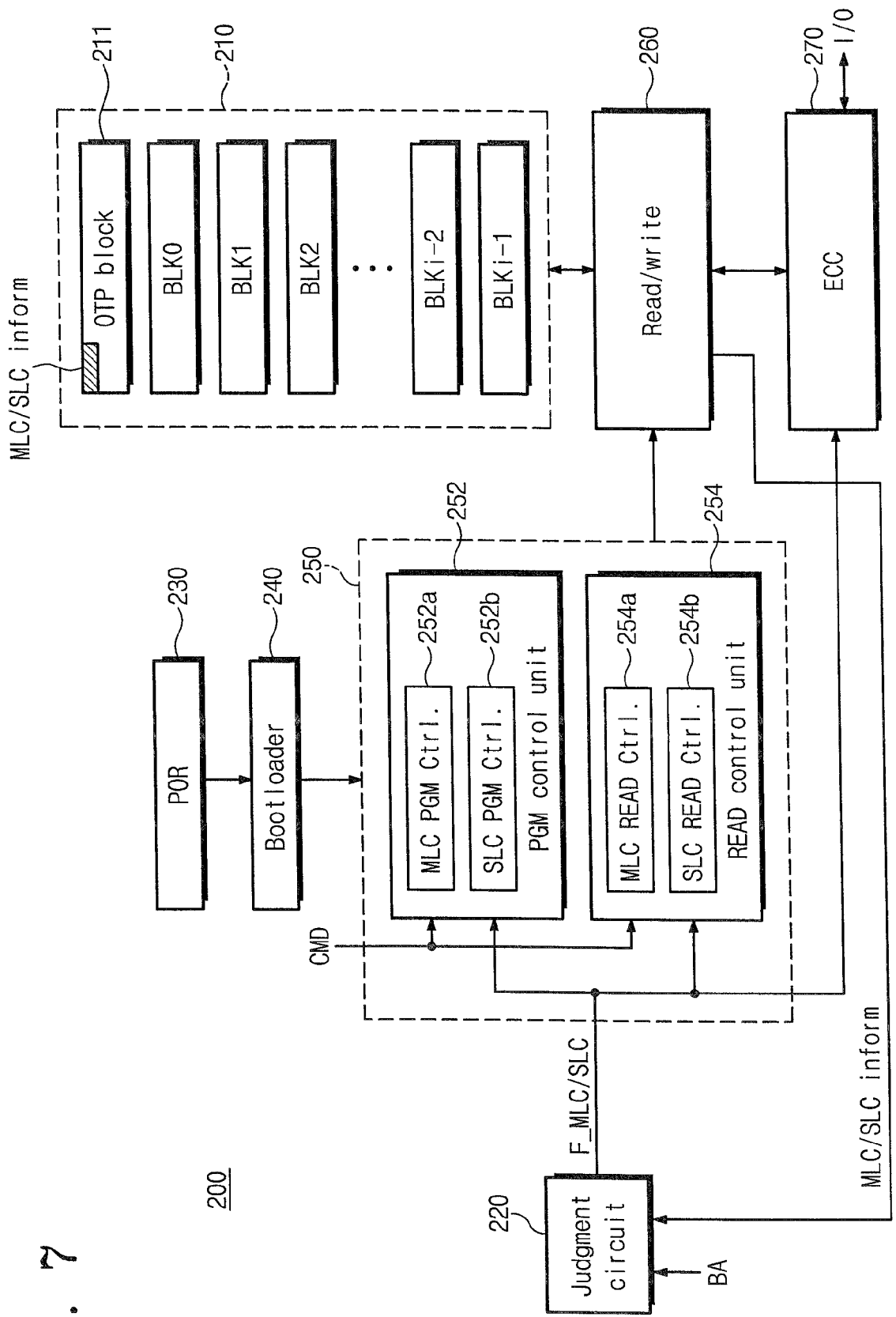
FIG. 7 is a block diagram showing a flash memory device according to a third embodiment of the present invention.

FIG. 7 is a block diagram showing a flash memory device 200 according to a third embodiment of the present invention. As shown in FIG. 7, the flash memory device 200 can include a memory cell array 210, a judgment circuit 220, a power-up reset (POR) circuit 230, a bootloader 240, control logic 250, a read/write control circuit 260 and an ECC circuit 270.

The memory cell array 210 has a plurality of memory blocks BLK0~BLKi-1 and at least one One-Time-Programmable (OTP) block 211. Each of the memory blocks BLK0~BLKi-1 may be configured identically to that illustrated in FIG. 2. The memory blocks BLK0~BLKi-1 can be divided into two groups with the first group used to store single-bit data and the second group used to store multi-bit data. MLC/SLC information, which can include block addresses for appointing first and final memory blocks for storing single-bit (or alternatively multi-bit) data, may be stored in the OTP block 211 of the memory cell array 210.

The judgment circuit 220 can be configured to store information indicating a multi-bit data storage region and a single-bit data storage region. That is, the judgment circuit 220 can store the block addresses for the first and final memory blocks used for multi-bit data storage. However, unlike the flash memory device 100 in FIG. 1, the flash memory device 200 in FIG. 7 can be configured to store MLC/SLC information read out from the OTP block 211 at power-up in the judgment circuit—as will be more fully described hereinafter.

In operation, the judgment circuit 220 can judge whether a memory block to be selected by a block address BA will be a multi-bit memory block or a single-bit memory block. As a judgment result, the judgment circuit 220 can generate a flag signal F_MLC/SLC that indicates whether or not the selected memory block is a multi-bit memory block. Note that when the judgment circuit 220 is configured the same as the judgment circuit 120 illustrated in FIG. 3, the block addresses for selecting a start and final memory block can be stored respectively in address storing units 122 and 124.

Continuing to refer to FIG. 7, the POR circuit 230 can be configured to generate a POR signal at power-up. The bootloader 240 can operate responsive to the POR signal to perform a predetermined boot-up read operation. For example, at power-up the bootloader 240 can output to the control logic 250 command and address information for reading out MLC/SLC information stored in the OTP block 211. As will be described below, MLC/SLC information (that is, block addresses of start and final memory blocks) read out from the OTP block 211 at power-up may be stored in the judgment circuit 220 under the control of the control logic 250.

The control logic 250 can control a read/write circuit 260 in response to the flag signal F_MLC/SLC from the judgment circuit 220 and a command signal CMD in normal operation. As shown in FIG. 7, the control logic 250 can include a program control unit 252 and a read control unit 254. In normal operation, the program control unit 252, which can include a multi-bit program controller 252a and a single-bit program controller 252b, can be configured to control a program operation of the memory device 200 when a command signal CMD indicates a program operation. When the flag signal F_MLC/SLC indicates selection of a multi-bit memory block at a normal operation, the multi-bit program controller 252a can be configured to control the read/write circuit 260 in response to the flag signal F_MLC/SLC and the command signal CMD. Otherwise, when the flag signal F_MLC/SLC indicates selection of a single-bit memory block at a normal operation, the single-bit program controller 252b can be configured to control the read/write circuit 260 in response to the flag signal F_MLC/SLC and the command signal CMD.

Similarly, in normal operation the read control unit 254, which can include a multi-bit read controller 254a and a single-bit read controller 254b, can be configured to control a read operation of the memory device 200 when a command signal CMD indicates a read operation. When the flag signal F_MLC/SLC indicates selection of a multi-bit memory block at a normal operation, the multi-bit read controller 254a can be configured to control the read/write circuit 260 in response to the flag signal F_MLC/SLC and the command signal CMD. Otherwise, when the flag signal F_MLC/SLC indicates selection of a single-bit memory block at a normal operation, the single-bit read controller 254b can be configured to control the read/write circuit 260 in response to the flag signal F_MLC/SLC and the command signal CMD.

In contrast with the normal operation of memory 200, at power-up the control logic 250 can control a boot-up read operation in response to command and address information from the bootloader 240. For example, at power-up the control logic 250 (e.g., the read control unit 254) can control the read/write circuit 260 so as to read MLC/SLC information of the OTP block 211 in response to command and address information from the bootloader 240. In turn, the read/write circuit 260, controlled by the control logic 250, can select one of the memory blocks BLK0~BLKi-1 at a normal read/program operation. The read/write circuit 260 can select a page/row in the selected memory block and read/store data from/to memory cells of the selected row. As with the read/write circuit 140 FIG. 1, the present read/write circuit 260 can be configured to store/read multi-bit data as well as single-bit data.

The ECC circuit 270 can produce ECC data based on data transferred to the read/write circuit 260 during a program operation, and provide the produced ECC data to the read/write circuit 260. The ECC circuit 270 can also detect errors for data transferred from the read/write circuit 260 during a read operation. In operation, the ECC circuit 270 can operate responsive to the flag signal F_LC/SLC from the judgment circuit 220 to check and correct errors. As described above, the ECC circuit 270 may include separate circuitry for separately processing multi-bit and single-bit data in order to check and correct for both multi-bit and single-bit data, or alternatively the ECC circuit 270 can be configured to check and correct for both multi-bit and single-bit data using a unified processing circuit.

As is evident from the above description, MLC/SLC information of the judgment circuit 120 in FIG. 1 can be stored using OTP memory, while the present judgment circuit 220 can be automatically set with MLC/SLC information stored in an OTP block 211 under the control of the bootloader 240 and the control logic 250 during every power-up.

Figure 8:
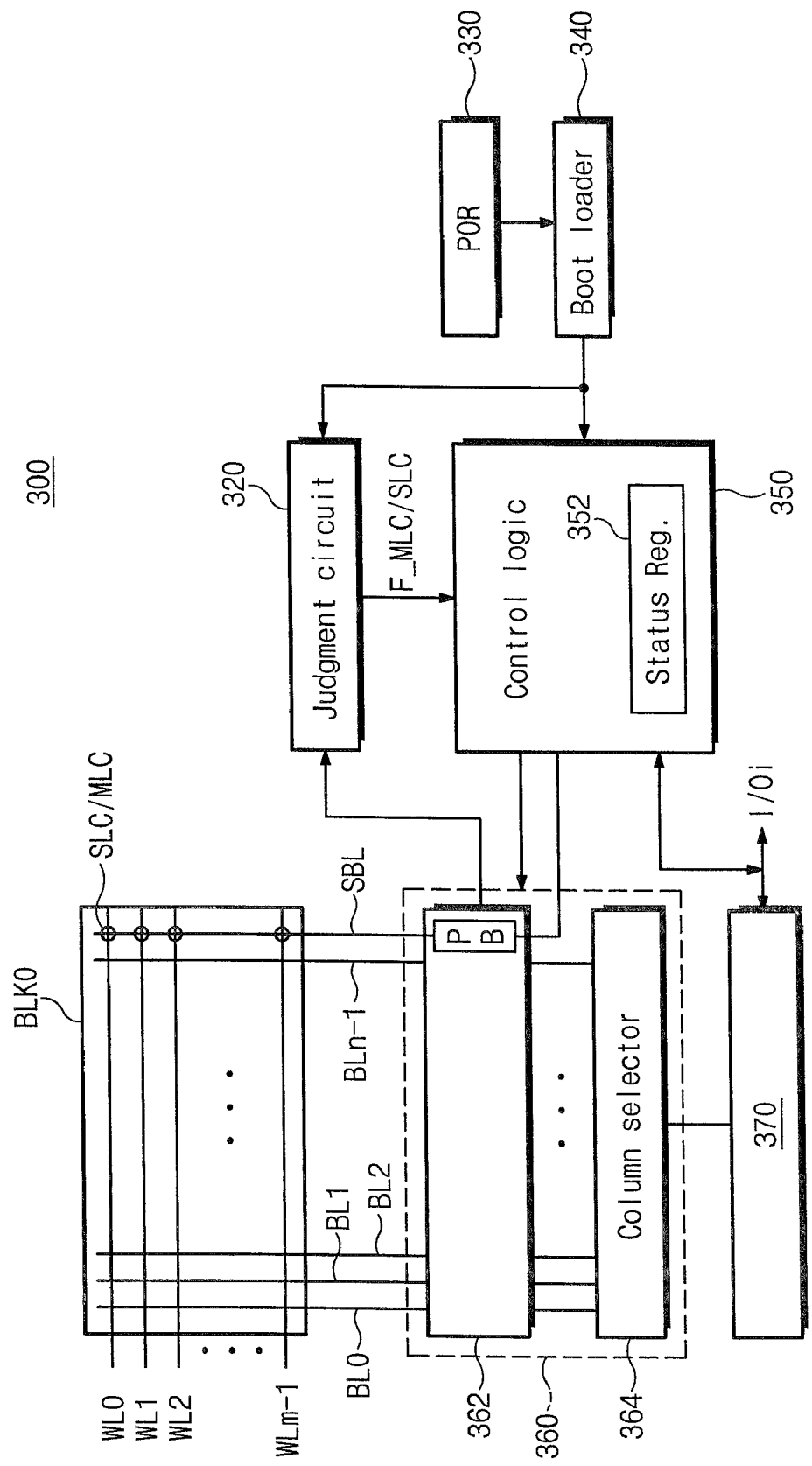
FIG. 8 is a block diagram showing a flash memory device according to a fourth embodiment of the present invention.

FIG. 8 is a block diagram showing a flash memory device 300 according to a fourth embodiment of the present invention. As shown in FIG. 8, the flash memory device 300 can include a memory cell array BLK0, a judgment 320, a power-up reset circuit 330, a bootloader 340, a control logic 350, a read/write circuit 360, and an ECC circuit 370. Constituent elements BLK0, 320, 350, 360, and 370 in FIG. 8 are substantially identical with those in FIG. 6, and description thereof is thus omitted. Further, the judgment circuit 320 in FIG. 8 may be configured the same as that in FIG. 4 and can include register regions that correspond to respective memory blocks to store MLC/SLC information.

The power-up reset (POR) circuit 330 can be configured to generate a POR signal at power-up. The bootloader 340 can operate responsive to the POR signal to perform a predetermined boot-up read operation. For example, the bootloader 340 can iteratively provide (to the control logic 350) command and address information for reading out MLC/SLC information from each memory block connected to a status bit line SBL until all memory blocks are selected. Status data (that is, MLC/SLC information of each memory block) read out at power-up may be stored in the judgment circuit 220. In this instance, address information (that is, a block address) and a latch signal LAT provided to each register region may be generated by the bootloader 340 or the control logic 350.

As understood from the above description, status data read out through the status bit line SBL at power-up may be stored in the judgment circuit 320 based on the control of the bootloader 340 and the control logic 350.

Figure 9:
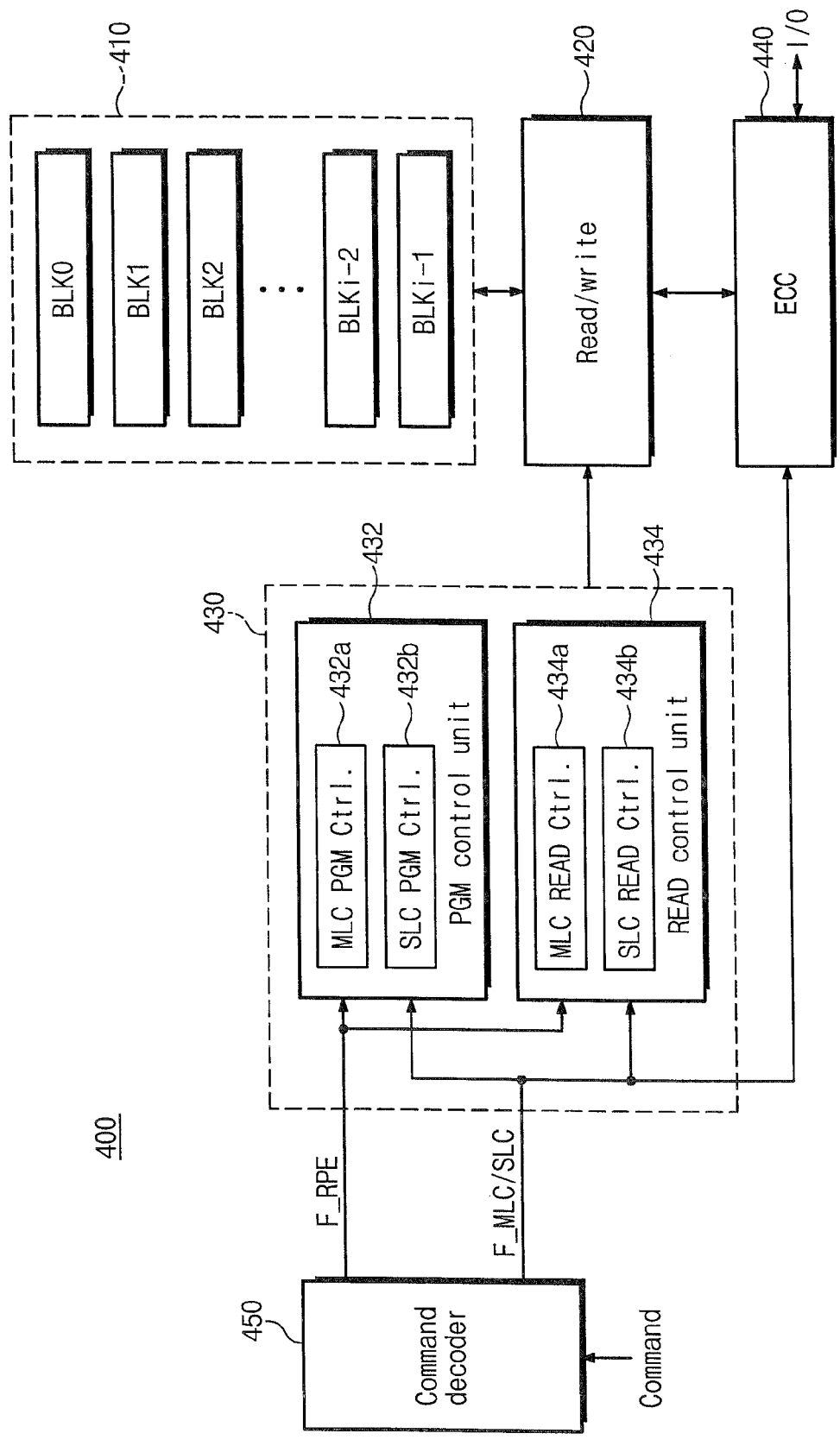
FIG. 9 is a block diagram showing a flash memory device according to a fifth embodiment of the present invention.

FIG. 9 is a block diagram showing a flash memory device 400 according to a fifth embodiment of the present invention. The present flash memory device 400 can communicate with an external host in any number of well-known NAND or later developed manners. As shown in FIG. 9, the flash memory device 400 can include a memory cell array 410, a read/write circuit 420, control logic 430, an ECC circuit 440, and a command decoder 450. Various constituent elements illustrated in FIG. 9 can be identical with those illustrated in FIG. 1, and description thereof is thus omitted.

In operation, the command decoder 450 can be configured to generate flag signals F_MLC/SLC and F_RPE in response to commands from the external host. For example, as the external host outputs first and second commands sequentially to the flash memory device 400 during a program/read operation, the command decoder 450 can produce the flag signals F_MLC/SLC and F_RPE in response. Note that typically the first command can indicate an operation of multi-bit or single-bit data, while the second command can indicate whether the requested operation is a program operation or a read operation.

For example, assuming that the first command indicates an operation for multi-bit data and that the second command indicates a program operation, the command decoder 450 can output the flag signal F_LC/SLC indicating an operation for multi-bit data and the flag signal F_RPE indicating a program operation. Alternatively, assuming that the first command indicates a program/read operation for multi-bit data and that the second command indicates a read operation, the command decoder 450 can output the flag signal F_MLC/SLC indicating an operation for multi-bit data and the flag signal F_RPE indicating a read operation.

Similarly, assuming that the first command indicates a program/read operation for single-bit data and that the second command indicates a program operation, the command decoder 450 can output the flag signal F_LC/SLC indicating an operation for single-bit data and the flag signal F_RPE indicating a program operation. Alternatively, assuming that the first command indicates a program/read operation for single-bit data and that the second command indicates a read operation, the command decoder 450 can output the flag signal F_MLC/SLC indicating an operation for single-bit data and the flag signal F_RPE indicating a read operation.

The control logic 430 can be configured to control the read/write circuit 420 in response to the flag signals F_LC/SLC and F_RPE from the command decoder 450. The read/write circuit 420 and the control logic 430 operate the same as those described above, and description thereof is thus omitted.

Figure 10A:
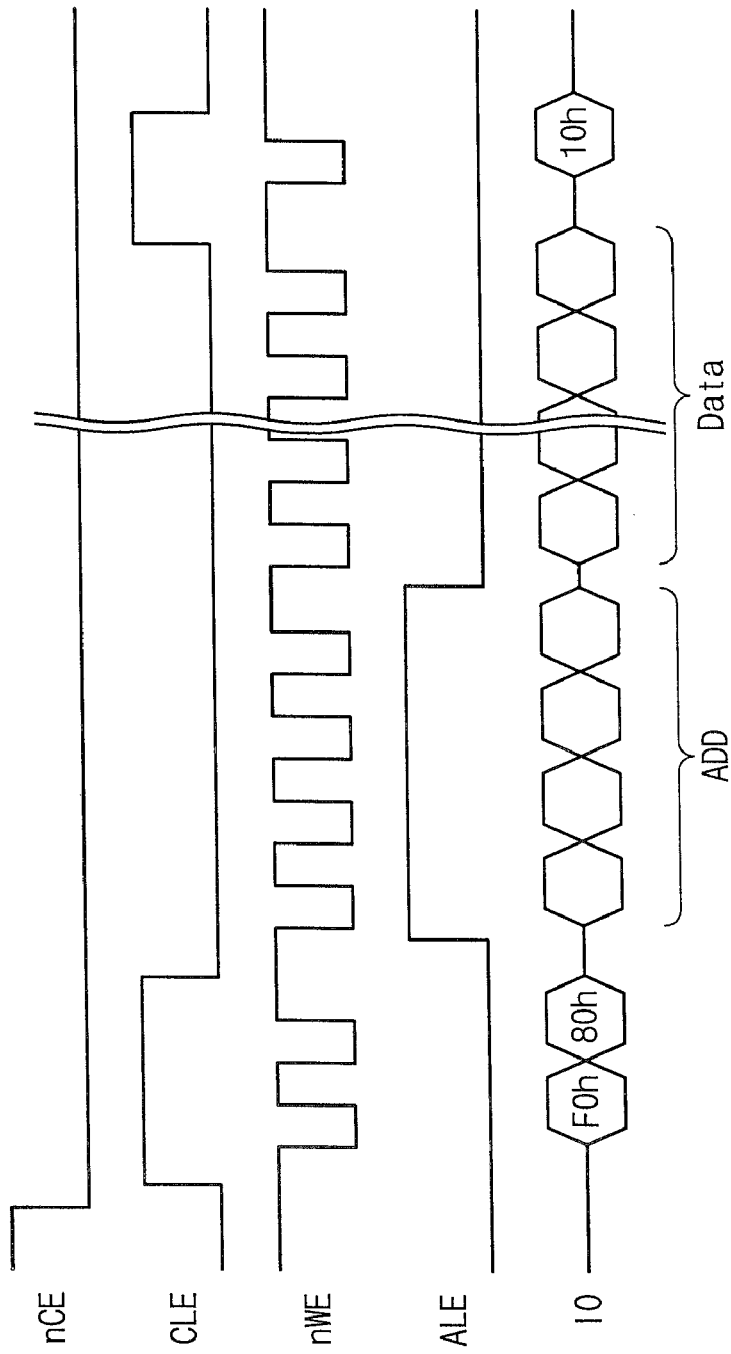
FIGS. 10A and 10B are timing diagrams for describing operations of a flash memory device in FIG. 9.
Figure 10B:
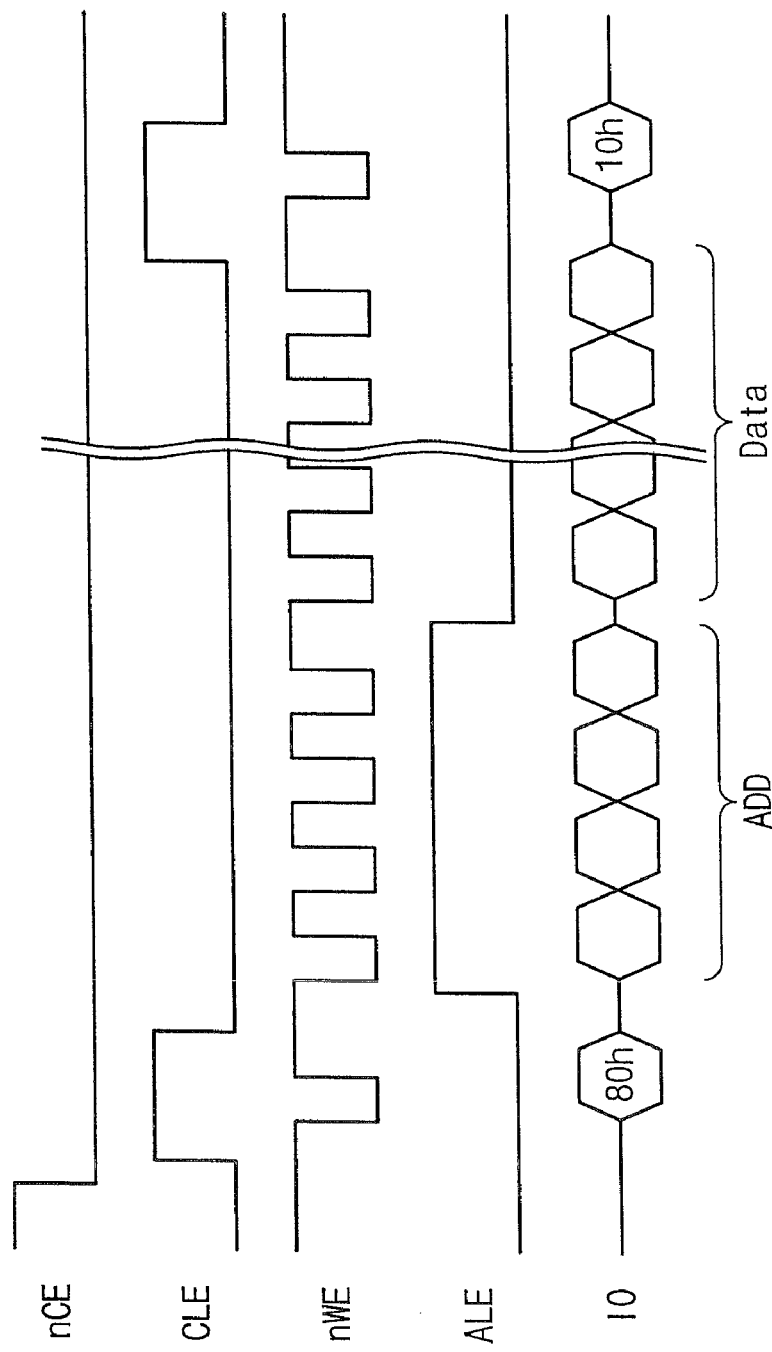

FIGS. 10A and 10B are timing diagrams for exemplary operations of the flash memory device 400 of FIG. 9. Starting with FIG. 10A, an external host can provide to the flash memory device 400 with a first exemplary command "F0*h*" and a second exemplary command "80*h*" according to a predetermined timing and protocol. For the present example, a first command of "F0*h*" indicates a multi-bit data operation, and a second command of "80*h*" indicates a program command. The third "10*h*" input is a second cycle portion of the "80*h*" program command. In response, the command decoder 450 of the flash memory device 400 can generates flag signals F_LC/SLC and F_RPE in response to the received command F0*h* and 80*h*, while the 10*h* will initiate the program operation. Since the first command "F0*h*" indicates a multi-bit data operation and the second command "80*h*" indicates a program command, the command decoder 450 can provide to control logic 430 a flag signal F_MLC/SLC indicating a multi-bit operation as well as a flag signal F_RPE indicating a program operation. In turn, the control logic 430 can control the program operation for multi-bit data in the same manner as described above, and description thereof is thus omitted.

Note that when a requested operation is not directed to multi-bit data, the first command "F0*h*" may be substituted with another exemplary command "F1*h*" specifying a single-bit operation, by which the command decoder 450 can provide to control logic 430 a flag signal F_MLC/SLC indicating a single-bit operation as well as a flag signal F_RPE indicating a program operation.

Continuing to FIG. 10B, it can be noted that the exemplary operations of the flash memory device 400 of FIG. 9 can forgo a first "F0*h*" or "F1*h*" command. Upon such instances, the data-type can revert to either multi-bit or single-bit by default, and the control logic 430 can generate a default flag signal F_MLC/SLC indicating either a multi-bit or single-bit operation.

As described above, the flash memory device 400 according to the fifth embodiment of the present invention can judge whether a requested operation by an external host is a multi-bit operation or a single-bit operation based on the command protocol.

Figure 11:
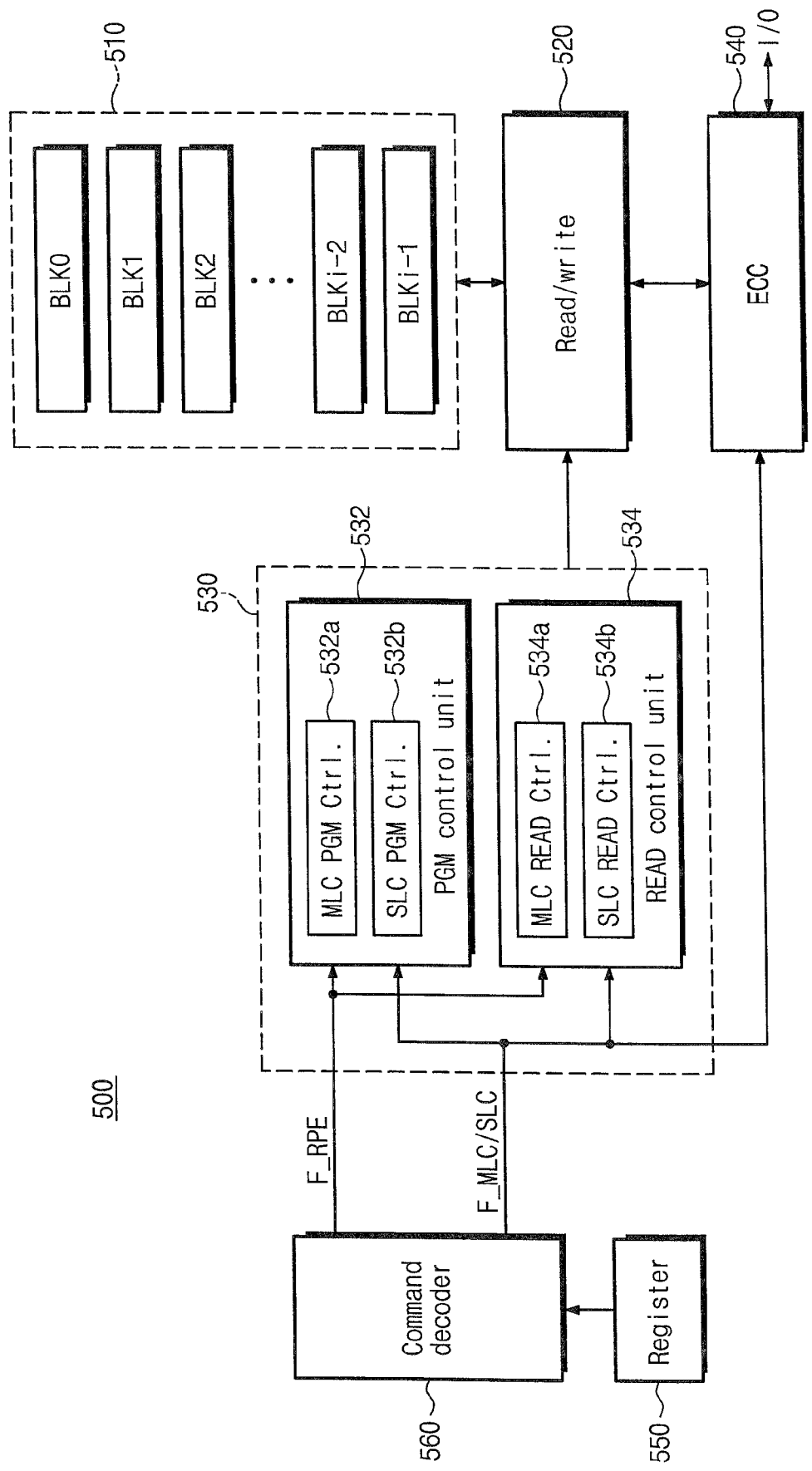
FIG. 11 is a block diagram showing a flash memory device according to a sixth embodiment of the present invention.

FIG. 11 is a block diagram showing a flash memory device according to a sixth embodiment of the present invention. This exemplary flash memory device 500 can communicate with an external host according to a well-known NOR flash memory device protocol. As shown in FIG. 11, the flash memory device 500 can include a memory cell array 510, a read/write circuit 520, control logic 530, an ECC circuit 540, a register 550, and a command decoder 550. Constituent elements 510, 520, 530, 540, and 560 illustrated in FIG. 11 are substantially identical with those illustrated in FIG. 9, and description thereof is thus omitted.

In operation, when a program or read operation is requested of the flash memory device 500, the external host 550 can store command and address information in the register 550 characteristic of the NOR flash interface. After the command and address information is stored in the register 550, the flash memory device 500 may perform a required operation based on the stored command and address information in the register 550. Note that commands in the register 550 may include one or more flags indicating whether a requested operation is a single-bit or multi-bit operation, a program or read command and so on. In response to these flags, the command decoder 560 can generate flag signals F_MLC/SLC and F_RPE, which can be operated upon in the manner described above.

Figure 12A:
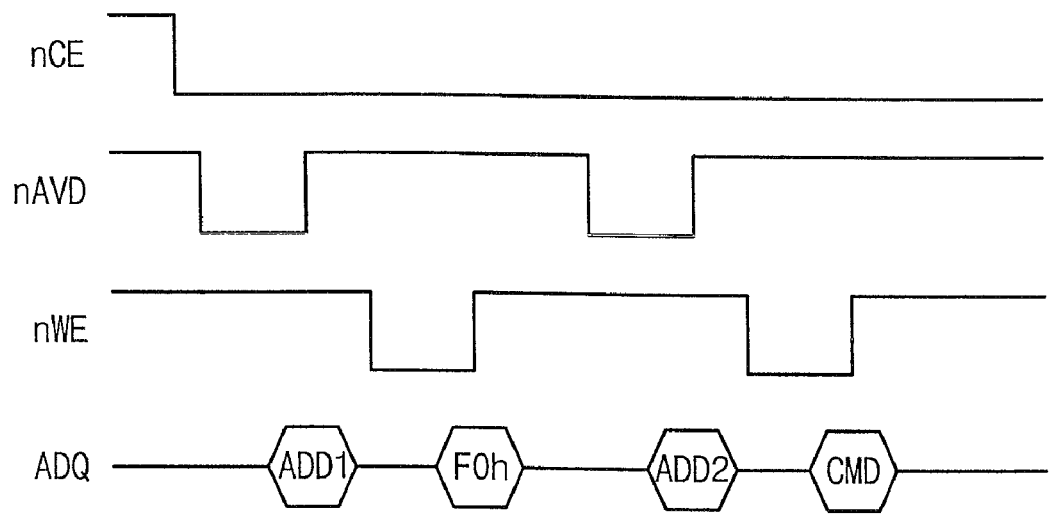
FIGS. 12A and 12B are timing diagrams for describing operations of a flash memory device in FIG. 11.
Figure 12B:
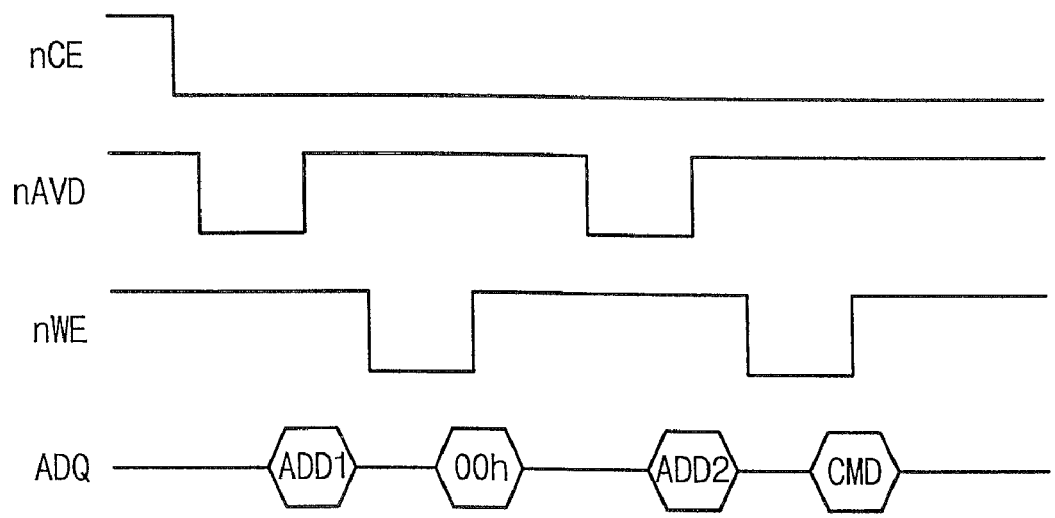

FIGS. 12A and 12B are timing diagrams for describing operations of a flash memory device in FIG. 11. Referring to FIG. 12A, according to a NOR flash interface protocol an external host can output to flash memory device 500 a first address ADD1, a first command F0*h*, a second address ADD2 and a second command CMD. The received addresses and commands can be stored in register 550. Note that the first and second addresses ADD1 and ADD2 are register addresses for selecting register regions in the register 550 in a manner similar to the judgment circuit 120 discussed with respect with FIGS. 4 and 5. The first command "F0*h*" can indicate a multi-bit data operation, and the second command CMD can indicate either a program or read operation.

Once the commands and addresses are received and stored in the register 550, command decoder 560 can generate flag signals F_MLC/SLC and F_RPE in response. Since the first command F0h indicates a multi-bit data operation, the command decoder 560 can provide to the control logic 530 a flag signal F_MLC/SLC indicating that a multi-bit data operation is to be performed. Should the second command indicate that a program operation is desired, the command decoder 550 can output a flag signal F_RPE indicating a program operation is desired. Subsequently, the control logic 530 can control the program operation for multi-bit data in the same manner as described above, and description thereof is thus omitted.

Note that when a requested operation is not directed to multi-bit data, the first command "F0h" may be substituted with another exemplary command "F1h" specifying a single-bit operation, by which the command decoder 560 can provide to control logic 530 a flag signal F_MLC/SLC indicating a single-bit operation as well as a flag signal F_RPE indicating a program operation.

Continuing to FIG. 12B, an exemplary command "00h" (specifying a read command) is shown provided to the flash memory device 500 of FIG. 11. In the present situation, no multi-bit or single-bit command may be necessary as the flag signal F_MLC/SLC may be generated based on the address block as defined by addresses ADD1 and ADD2.

As described above, the flash memory device 500 according to the sixth embodiment of the present invention can judge whether a required operation by the external host is an access operation for a multi-bit data storage region based on an exemplary command protocol.

As described above, according to the present invention, some memory blocks are used as the multi-bit storage region and the others are used as the single-bit storage region in a memory cell array, and thus, it is possible to reduce the increase of system cost incurred by separately using the memory for storing the multi-bit data and the memory for storing the single-bit data. In addition, when the external host looses the information for designating the multi-bit storage region and the single-bit storage region, it is possible to recover the lost information by additionally employing the status bit line.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A flash memory device, comprising:
    a memory cell array including a plurality of memory blocks;
    a judgment circuit for storing multi-bit/single-bit information indicating whether each of the memory blocks is a multi-bit memory block or not, determining whether or not an inputted block address corresponds to a multi-bit memory block based on the stored multi-bit/single-bit information and outputting a multi-bit/single-bit flag signal indicative of whether the inputted block address corresponds to a multi-bit memory block;
    a read/write circuit for selectively performing multi-bit and single-bit read/program operations of a memory block corresponding to the inputted block address; and
    control logic for controlling the read/write circuit such that the read/write circuit performs multi-bit or single-bit read/program operations based on the multi-bit/single-bit flag signal,
    wherein the read/write circuit stores the multi-bit/single-bit information to a selected memory block in a program operation of the selected memory block under control of the control logic.

2. The flash memory of claim 1, wherein the memory cell array is partitioned into a multi-bit storage region and a single-bit storage region.

3. The flash memory of claim 2, wherein the judgment circuit comprises:
    a first block address storing unit for storing a first block address identifying a first memory block among the memory blocks of the multi-bit storage region;
    a second block address storing unit for storing a second block address identifying a final memory block among the memory blocks of the multi-bit storage region; and
    a detector for detecting whether or not the inputted block address is between the first and second block addresses, and outputting the flag signal as a detection result.

4. The flash memory device of claim 3, wherein the first and second block addresses are respectively provided to the first and second block address storing units from an external source at power-up.

5. The flash memory device of claim 3, wherein the memory cell array further comprises a one-time programmable (OTP) block for storing the first and second block addresses as the first and second block addresses.

6. The flash memory device of claim 5, wherein the first and second block addresses in the OTP block are respectively stored in the first and second block address storing units based on a control of a bootloader at power-up.

7. The flash memory device of claim 2, wherein the judgment circuit comprises:
    a decoder for decoding a register address to activate one of a number of selection lines corresponding to the respective memory blocks;
    a register having register regions corresponding to the respective selection lines, for storing the multi-bit/single-bit information when the corresponding selection line is activated; and
    a selector for selecting one of the register regions in response to the block address, and outputting multi-bit/single-bit information of the selected register region as the flag signal.

8. The flash memory device of claim 7, wherein multi-bit/single-bit information of the memory blocks is selectively stored in the register regions through the decoder at power-up.

9. The flash memory device of claim 5, wherein the register regions are initialized such that the memory blocks are set to either one of a single-bit memory block and a multi-bit memory block.

10. The flash memory device of claim 1, wherein the memory cell array includes a status bit line shared by the memory blocks.

11. The flash memory device of claim 10, wherein during the program operation where data is programmed to the selected memory block selected by the block address, the control logic controls the read/write circuit in response to the flag signal such that multi-bit/single-bit information is stored in the selected memory block through the status bit line.

12. The flash memory device of claim 1, wherein the multi-bit/single-bit information being stored to the selected memory block is provided from an external device.

13. The flash memory device of claim 10, wherein after the program operation where data is programmed to the selected memory block selected by the block address, the control logic controls the read/write circuit such that multi-bit/single-bit information is stored in the selected memory block through the status bit line.

14. The flash memory device of claim 10, wherein the control logic controls the read/write circuit such that multi-bit/single-bit information of the memory block selected through the status bit line is read out to an external device during a status read operation.

15. The flash memory device of claim 10, wherein the control logic is controlled by a bootloader at power-up such that multi-bit/single-bit information of each of the memory blocks is read out through the status bit line, the read-out information being stored in the judgment circuit as the multi-bit/single-bit information.

16. The flash memory device of claim 1, wherein the control logic comprises:

a program control unit including a multi-bit program controller for controlling a multi-bit program operation of the read/write circuit, and further including a single-bit program controller for controlling a single-bit program operation of the read/write circuit; and a read control unit including a multi-bit read controller for controlling a multi-bit read operation of the read/write circuit, and further including a single-bit read controller for controlling a single-bit read operation of the read/write circuit, wherein the multi-bit and single-bit program controllers operate selectively according to the flag signal, and the multi-bit and single-bit read controllers operate selectively according to the flag signal.

\* \* \* \* \*